United States Patent
Doyle et al.

(10) Patent No.: US 6,300,662 B1
(45) Date of Patent: Oct. 9, 2001

(54) ELECTRONIC PROGRAMMABLE READ-ONLY-MEMORY INCLUDING A CHARGE STORAGE CAPACITOR COUPLED TO THE GATE ELECTRODE

(75) Inventors: Denis Doyle, Limerick (IE); Kieran Nunan, Carlisle, MA (US); Michael O'Neill, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 585 days.

(21) Appl. No.: 08/722,738

(22) Filed: Oct. 1, 1996

(51) Int. Cl.[7] .................. H01L 27/108; H01L 29/76; H01L 29/94; H01L 31/113
(52) U.S. Cl. .................. 257/390; 257/300; 257/336; 257/408
(58) Field of Search .................. 257/296, 298, 257/300, 336, 344, 408, 390

(56) References Cited

U.S. PATENT DOCUMENTS

| 5,046,043 | * | 9/1991 | Miller et al. | 257/298 |
| 5,146,300 | * | 9/1992 | Hamamoto et al. | 257/300 |
| 5,300,799 | * | 4/1994 | Nakamura et al. | 257/300 |

FOREIGN PATENT DOCUMENTS

| 63-66967 | * | 3/1988 | (JP) | 257/344 |
| 6-132489 | * | 5/1994 | (JP) | 257/344 |

* cited by examiner

Primary Examiner—Olik Chaudhuri
Assistant Examiner—Howard Weiss
(74) Attorney, Agent, or Firm—Samuels, Gauthier & Stevens, LLP

(57) ABSTRACT

An electronic programmable read-only-memory (EPROM) is provided having a field effect transistor with the gate electrode thereof coupled to a capacitor adapted to store charge produced in a channel region of the transistor in response to a logic state programming voltage applied between one of the source and drain regions and the gate electrode. The field effect transistor and the capacitor are formed in a common semiconductor body along with CMOS transistors. The field effect transistor has relatively heavy doped source and drain regions separated by an oppositely doped channel region. A gate electrode is disposed over the channel region. Lightly doped regions, having the same conductivity type as the source and drain regions, extend laterally from the source and drain regions to peripheral regions of the channel region to suppress generation of "hot" electrons in the transistor and the CMOS transistors. Relatively heavy doped regions are selectively formed in the field effect transistor of the EPROM are inhibited from being formed in the CMOS transistors. The relatively heavy doped regions have the same conductivity type as the source and drain regions and extending laterally from the source and drain regions, through and beyond the lightly doped regions, into the channel region. The additional, heavily doped regions are formed when heavily doped ESD regions are formed for diodes coupled to contact pads to prevent electrostatic discharge effects from harming the devices.

6 Claims, 7 Drawing Sheets

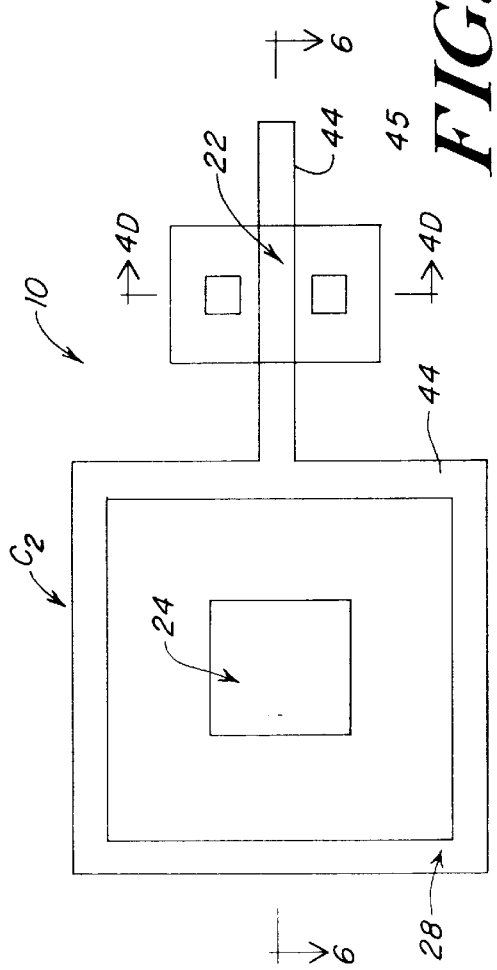
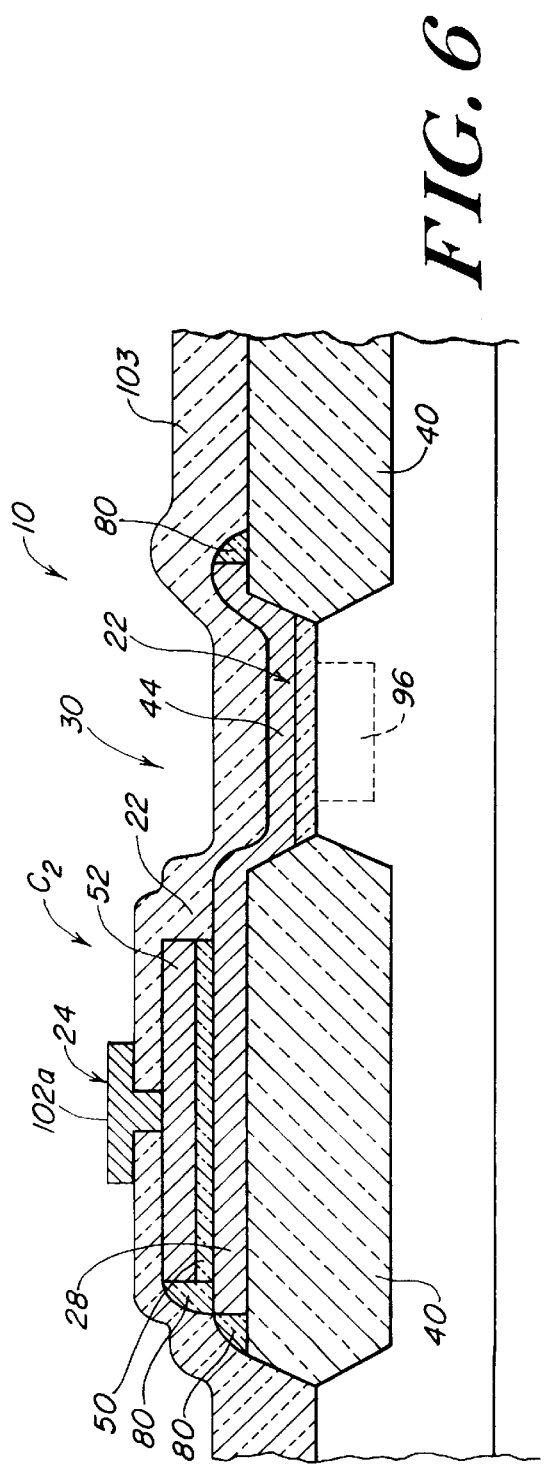

ELECTRONIC PROGRAMMABLE READ-ONLY-MEMORY INCLUDING A CHARGE STORAGE CAPACITOR COUPLED TO THE GATE ELECTRODE

BACKGROUND OF THE INVENTION

This invention relates generally to electronic programmable read-only-memories (EPROMs) and methods for fabricating EPROMs using sub-micron complementary metal oxide silicon (CMOS) processing techniques.

As is known in the art, EPROMs have a wide range of applications. One such EPROM device, here an ultraviolet (UV) erasable EPROM cell 10', is shown in FIG. 1 to include a pair of heavily doped, here N+, source and drain regions 12', 14' formed in a field oxide 11' isolated P type conductivity well 16' of a P type conductivity silicon body 18'. A carrier channel 20', here having a length greater than a micron, is disposed between the pair of source and drain regions 12', 14'. Disposed over the carrier channel 20' is a floating polycrystalline silicon gate 22' separated by dielectric layer 23' from the channel 20' and from a control gate 24' by a dielectric layer 26'. The dielectric layer 23' is typically a thermally grown silicon dioxide layer used to form a gate oxide for dielectric separation between the floating gate 22' and the surface of the silicon, (i.e., to prevent the floating gate 26' from short circuiting the source and drain regions 12', 14'). The dielectric layer 26' is typically silicon dioxide, or silicon dioxide and silicon nitride, used between the floating gate 22' and the control gate electrode 24'. It is noted that: the floating gate 22' and the control gate 24' are disposed in a vertical, or self-aligned arrangement. The heavily doped source and drain regions 12', 14', together with the control gate electrode 24', are used for programming the logic state of the cell. More particularly, to program the cell, a relatively high positive voltage, i.e., 12 to 15 volts, is applied to the control gate electrode 24' relative to the drain region 14', with the source region 12' being grounded. This relatively high positive voltage produces a relatively high, vertically oriented, electric field near the drain region 14' of sufficient intensity to attract "hot" electrons generated near the doped drain region 14' through the gate oxide 23' into the floating gate 22'. Thus, in this programmed state, (i.e., with "hot" electrons (i.e., carriers) in the floating gate 22',) the threshold voltage of the cell 10' is increased from its initial, UV erased state. Having been programmed, the cell 10' is now operated in a normal operating mode with a lower, i.e., 5 volt, control gate electrode voltage 24'. The difference in threshold voltage of the cell 10' is detected to determine storage by the cell of either a logic 0 bit or a logic 1 bit. To remove the stored "hot" electrons from the floating gate, UV light is again directed onto the cell 10' through a passivation layer, not shown, over the surface of the cell 10' and through a UV transparent window, not shown, provided in a package, not shown.

As is also known in the art, use of such EPROMs with CMOS devices on a common silicon substrate have been used in a wide range of applications. For example, complementary metal oxide silicon (CMOS) devices have been used to form microprocessors and the EPROMs have been used for storage of calibration coefficients, storage of die identification number, in addition to program storage for the microprocessor. (A typical NMOS FET 30' used with a PMOS FET, not shown, to form CMOS devices, is shown in FIG. 2.) However, incorporation of an EPROM cell into a standard sub-micron CMOS process is difficult for a variety of reasons: Self-aligned polycrystalline silicon floating and control gate electrodes 22', 24' (FIG. 1) are not commonly used in CMOS processing; Because the channel length of the CMOS device is now less than a micron, control electrode voltages as low as 5 volts may result in "hot" electrons being generated thereby requiring the CMOS devices to include lightly doped "hot" electron suppression regions 15' shown in FIG. 2, to avoid high electric fields obtained with an abrupt drain-channel junction, as shown in FIG. 1 and thereby suppress generation of "hot" electrons; and, CMOS passivation layers may not allow UV to pass into the cell thereby preventing erasing of the bit stored by the cell.

SUMMARY OF THE INVENTION

In accordance with the present invention, an electronic programmable read-only-memory (EPROM) is provided having a field effect transistor (FET) the gate electrode thereof coupled to a capacitor adapted to store charge produced in a channel region of the transistor in response to a logic state programming voltage applied to the EPROM. The field effect transistor and the capacitor are formed in a common semiconductor body along with CMOS transistors. The field effect transistor of the EPROM and the CMOS transistors have relatively heavy doped source and drain regions separated by an oppositely doped channel region. A gate electrode is disposed over the channel region. Lightly doped regions, having the same conductivity type as the source and drain regions, extend laterally from the source and drain regions to peripheral regions of the channel region to suppress generation of "hot" electrons in the EPROM FET and the CMOS FETs. Additional, relatively heavy doped regions are selectively formed in the EPROM FET and are inhibited from being formed in the CMOS transistors. The relatively heavy doped regions have the same conductivity type as the source and drain regions and extend laterally from the source and drain regions, through and beyond the lightly doped regions, into the channel region. The charge storing capacitor is coupled to the gate electrode and is adapted to store charge produced in the channel region in response to a logic state programming voltage applied to the EPROM.

With such an arrangement, the additional, relatively heavily doped regions formed selectively in the EPROM FETs dominate the EPROM FET lightly doped "hot" electron suppression regions to thereby enable generation of "hot" electrons during programming of such EPROM. In a preferred embodiment, the additional, heavily doped regions are formed when heavily doped electrostatic discharge (ESD) regions are formed for devices coupled to contact pads to prevent electrostatic discharge effects from harming other devices in the circuit.

In accordance with another feature of the invention, a method of forming a electronic programmable read-only-memory is provided. The method includes the step of forming a semiconductor body having formed therein relatively lightly doped source and drain regions separated by a channel, and a gate electrode disposed over an inner portion of the channel, lightly doped regions extending from the source and drain regions to a region in the channel disposed under the gate electrode. A relatively heavy doped region is formed in a relatively lightly doped region to provide a relatively highly doped region from the source and drain regions to regions disposed under the gate electrode. A charge storing capacitor is formed coupled to the gate electrode, such charge storing capacitor being adapted to store charge produced in the channel in response to a logic state programming voltage applied between the body and one of the source and drain regions.

BRIEF DESCRIPTION OF THE DRAWING

These and other features of the invention will become more readily apparent from the following detailed description taken together with the accompanying drawings, in which:

FIG. 5 is a diagrammatical plan view sketch of the EPROM cell of FIG. 3, the cross-section of FIG. 4D being taken along line 4D—4D in FIG. 5;

FIG. 6 is a diagrammatic cross-sectional sketch of the EPROM cell of FIG. 5, such cross section being taken along line 6—6 in FIG. 5.

DESCRIPTION OF THE PREFERRED EMBODIMENTS

Figure 3:
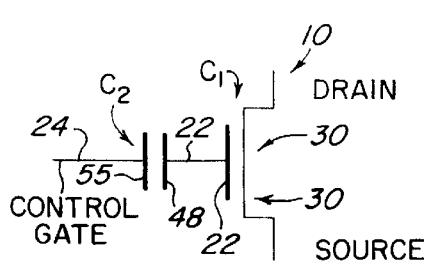
FIG. 3 is a schematic diagram of an EPROM cell according to the invention.

Referring now to FIG. 3, an equivalent circuit of an EPROM cell 10 is shown to include a capacitor C2 in series with the floating gate electrode 22 of a N-type MOSFET 30 (i.e., NMOS field effect transistor). Capacitor C1 is formed between the P-well and the floating gate 26 and capacitor C2 is formed between the floating gate 26 and the control gate 24. Here, the capacitor C2 is shown displaced from the MOSFET 30. Therefore, the EPROM cell 10 is made up of a capacitor C2 and an MOSFET 30 and does not require that the capacitor C2 be "stacked" or self-aligned with the control gate 24; although a non-self-aligned structure would require a larger chip surface area.

Figure 4A:
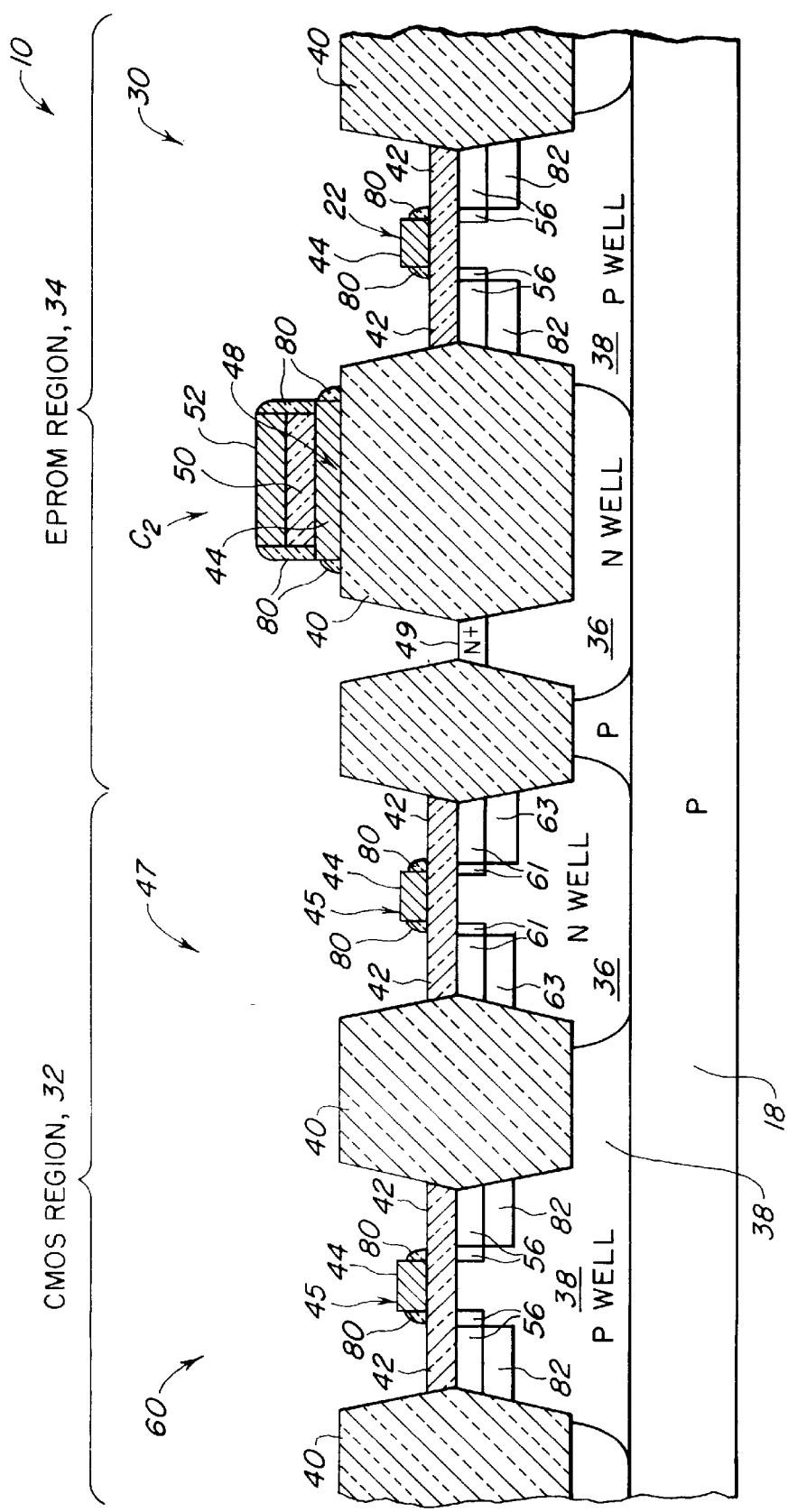
FIGS. 4A through 4D are diagrammatic cross-sectional sketches of a sub-micron MOS transistor according to the invention at various stages in the fabrication thereof.

Referring now to FIG. 4A, a P type conductivity substrate 18 having a CMOS transistor region 32 and an EPROM region 34, is shown. The structure shown in FIG. 4A is formed by forming N type conductivity wells 36 in the P type conductivity layer 18 and P well regions 38 of the P type conductivity in the P type conductivity layer 18. The N type conductivity wells 36 and the P type conductivity wells 38 terminate along laterally spaced upper surface portions of the substrate 18. Field silicon dioxide isolation regions 40 are formed in portions of the layers 36, 38 to electrically isolate the CMOS devices to be formed in CMOS region 32 and EPROM devices to be formed in the EPROM region 34 using any conventional local oxidation process. A gate oxide layer 42 (i.e., a silicon dioxide layer) is then thermally grown along the surface of the structure, as shown. A layer 44 of polycrystalline silicon (here polycrystalline silicon and tungsten silicide) is then chemically vapor deposited over the thermally grown gate silicon dioxide layer 42. The layer 44 of polycrystalline silicon is then doped, here with phosphorous, to render such polycrystalline silicon layer 44 conductive. The doped polycrystalline silicon layer 44 is then patterned using conventional photolithographic-chemical etching techniques into control gate electrodes 45 for CMOS FETs in the CMOS region 32 and in the EPROM region 34, into the floating gate 22 of EPROM FET 30 and the bottom plate 48 of the capacitor C2 (FIG. 3).

Figure 1:
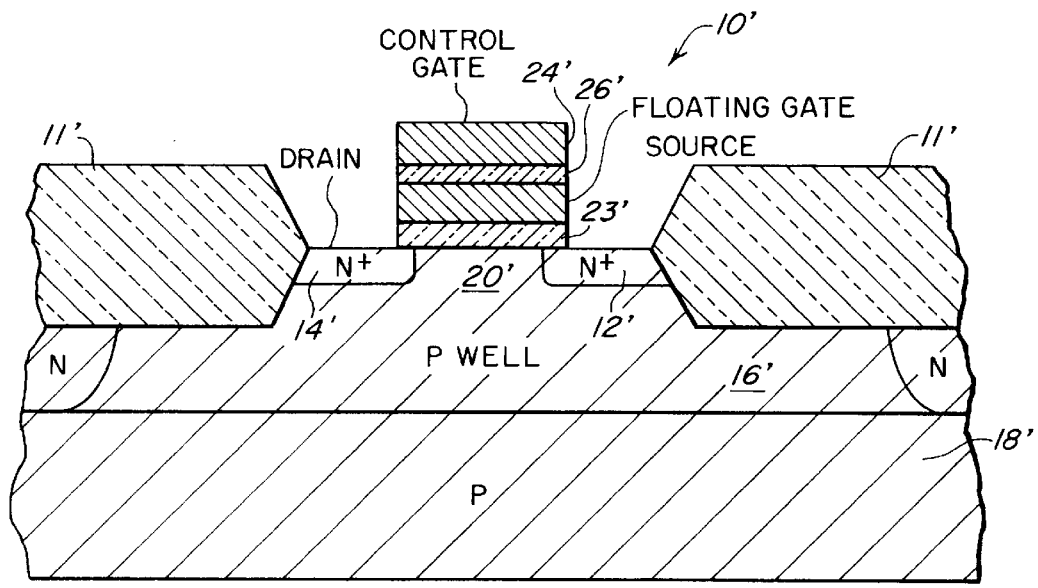
FIG. 1 is a diagrammatic, cross-sectional sketch of an EPROM cell according to the PRIOR ART.
Figure 2:
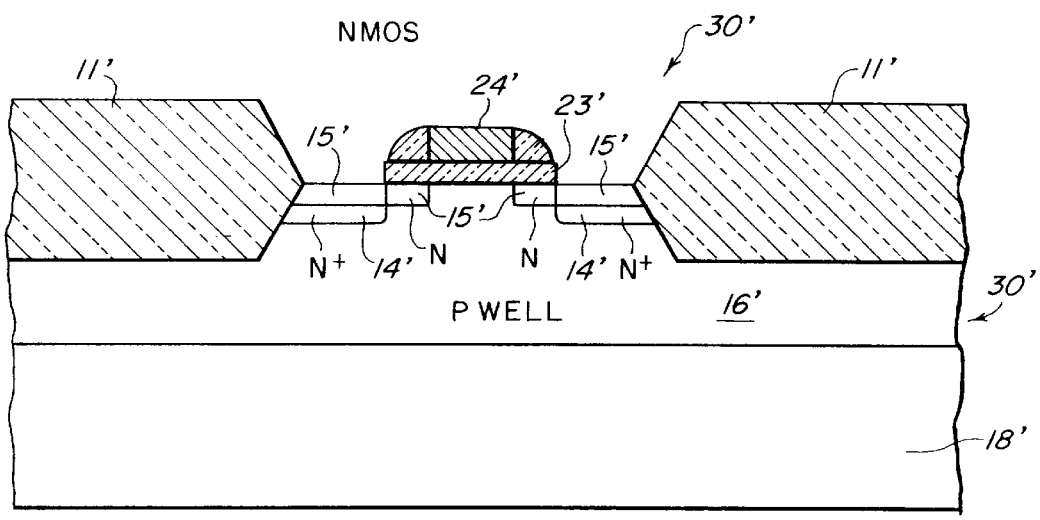
FIG. 2 is a diagrammatic cross-sectional sketch of a sub-micron NMOS transistor according to the PRIOR ART.

A dielectric layer 50 of silicon dioxide is then formed over the structure. A second, upper layer 52 of polycrystalline silicon is formed over the dielectric layer 50 and then doped in a manner similar to that used in forming the lower doped polycrystalline silicon layer 44. The second, upper doped layer 52 of polycrystalline silicon is patterned to form the upper plate 55 of the capacitor C2. A timed wet etch, here diluted hydrofluoric acid, is used to remove, i.e., back etch, exposed portion of the chemically vapor deposited (CVD) silicon dioxide layer 50. The etch is performed to leave the gate oxide layer 42, it being noted that the etch rate of the chemically deposited (CVD) silicon dioxide layer 50 etches at a rate three times greater than the etch rate of thermally grown silicon dioxide layer 42. Using the control gate electrodes 45 for the NMOS transistor and the floating gate electrode 22 as an ion implantation mask and with the PMOS FET regions 47 masked, lightly doped regions 56 of N type conductivity are implanted into the unmasked regions of the NMOS FETS 60 in the CMOS region 32 and into the NMOS FET 30 in the EPROM region 34. These lightly doped regions 56 are used by the sub-micron CMOS FETs 60 as lightly doped "hot" electron suppression regions 15' discussed above in connection with FIG. 2. That is, regions 56 are formed in the CMOS NFETs 60 to avoid high electric fields obtained with an abrupt drain-channel junction, as shown in FIG. 1 and thereby suppress generation of "hot" electrons. Here, the dopant: is phosphorous atoms and is ion implanted to provide a doping concentration of about $10^{17}$ atoms per $cm^2$. It is noted that the regions 56 are formed for all NMOS transistors 60 in the CMOS region 32, the conventional electrostatic discharge (ESD) protection transistors, not shown, (typically used to buffer ESD effects which may occur on the contact pads, not shown, from other circuit devices, such as the EPROMs 10 and CMOS FETs 47, 60), and the NMOS FET 30 in the EPROM region 34.

With the NMOS FETs 30, 60 formed, they are masked, while the mask over the regions where PMOS FETs 47 are to be formed is removed, enabling formation of lightly doped P type conductivity regions 61 for the PMOS FETs 47 in the CMOS region 32 in like manner as the formation of the NMOS FETs 30, 60 but with P type conductivity dopants in place of N type conductivity dopants.

Next, dielectric, here silicon dioxide spacers 80, are formed by: depositing chemical vapor depositing (CVD) silicon dioxide over the structure and then using a time etch-back, here a dry plasma etch, thereby leaving only the thicker portions of the CVD silicon dioxide formed about the step interface between the thermal gate oxide 42 and the doped polycrystalline silicon gates 22, 45. The spacers 80 are also formed about the step interface between the thermal field oxide 40 and the bottom plate 48 of capacitor C2, i.e., layer 44 and also between the bottom plate 48 and the layer 55 of top plate 52. Next, using the patterned layer 44 (i.e., control gates 45 and floating gate 22) and spacers 80 as an ion implantation mask, and with the PMOS FETs 47 masked, heavily doped, $N^+$, source/drain regions 82 are formed by ion implanting arsenic at $10^{19}$ atoms/$cm^2$ into the unmasked portions of the surface where NMOS FETs 30, 60 are to be formed. It is noted that the steps described in connection with FIG. 4A are used to form all N channel FETs for both EPROM region 34, the CMOS region 32 and the NMOS FETs, not shown, used for ESD protection. That is, the processing described above in connection with FIG. 4A is performed throughout the surface of the substrate. Also the implant is used to form an N+ ohmic contact region 49 for reasons to be discussed.

Next, with the PMOS FET areas; uncovered and the NMOS FET areas covered, P+ type conductivity source and drain regions 63 are formed for the PMOS FETs. 47.

Figure 4B:
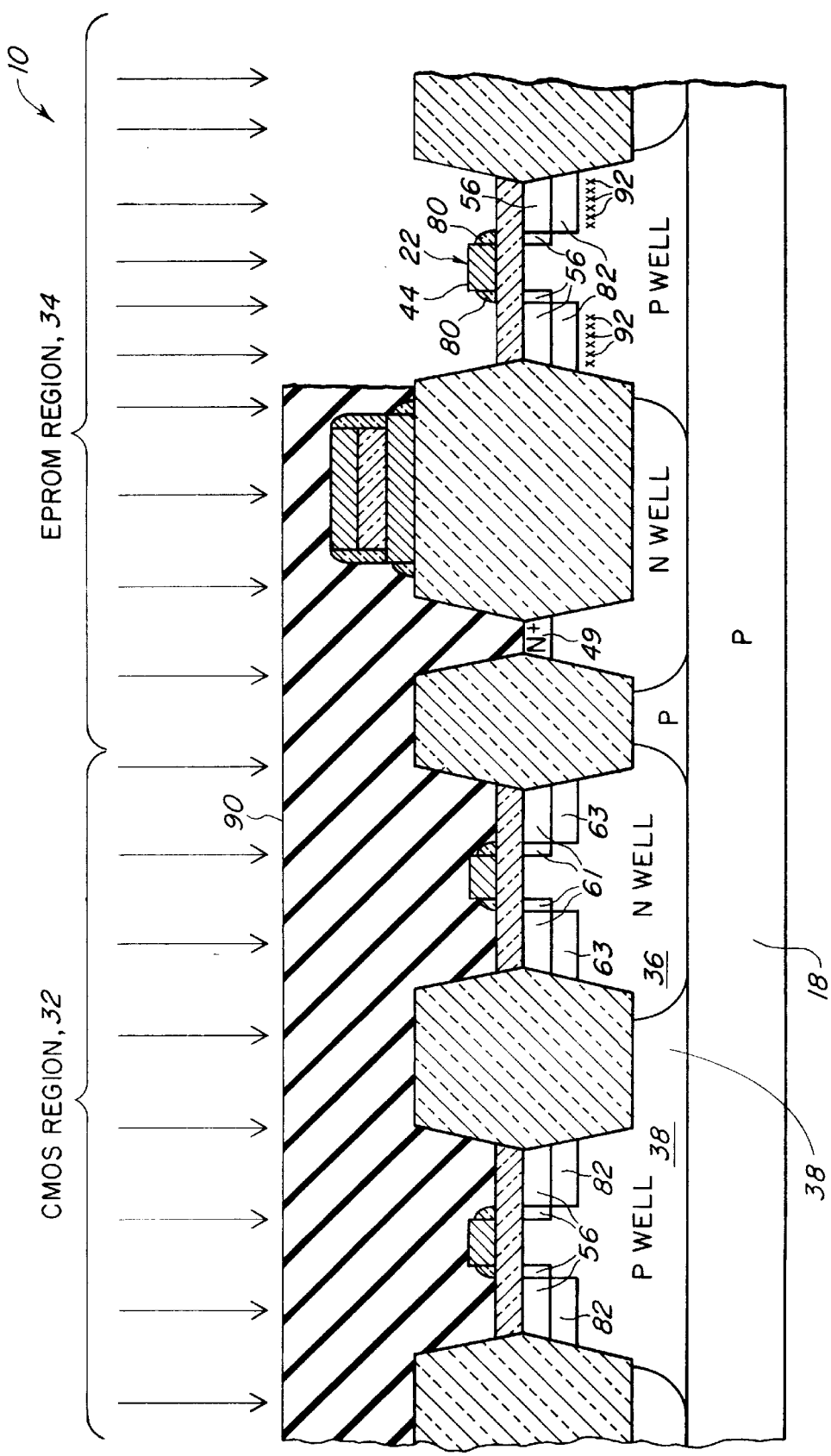
Figure 4C:
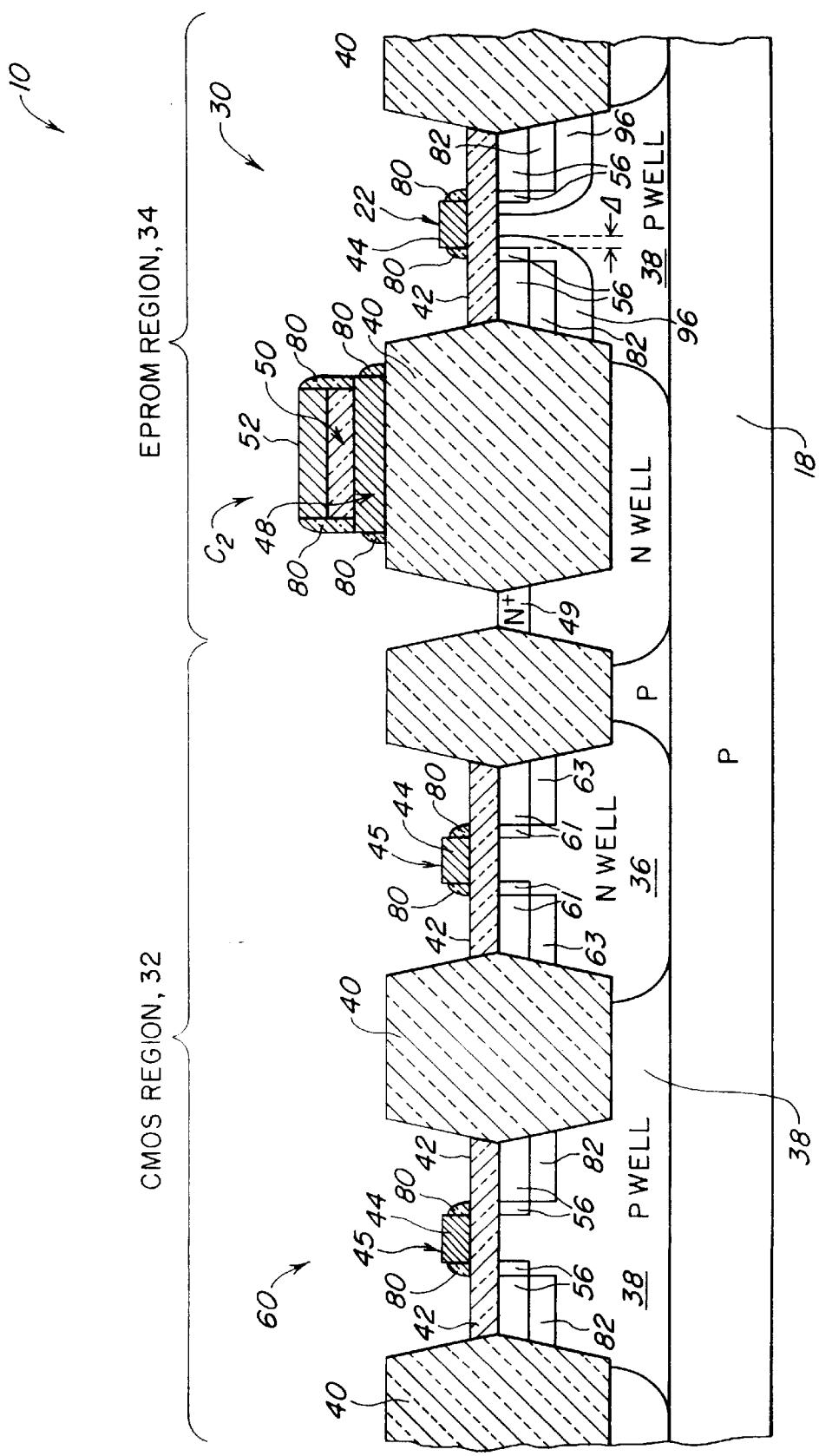

Referring now to FIG. 4B, using a mask 90, as shown, to block the CMOS regions 32 (i.e, the regions where CMOS FETs are to be formed), the capacitor C2 portion of the EPROM region 34 and exposing the EPROM NFET 30 portion of the EPROM region 34 where the EPROM FET 30 and the ESD FET, not shown, are to be formed, heavily doped phosphorous atoms 92 (indicated by X in FIG. 4B) are implanted, here to provide a doping concentration of about $10^{19}$ atoms/cm$^2$. The structure is then heated, activating the implanting phosphorus atoms 92. Because the phosphorous dopant diffuse faster than the arsenic dopant in regions 56, the phosphorous dopant diffuses laterally beyond the regions directly beneath the edges of the spacers 80. Typically, the phosphorus dopant diffuses, Δ, here about 0.1 microns laterally beyond the edges of the spacers 80, as shown in FIG. 4C to form N$^+$ regions 96. These additional N$^+$ regions 96 formed selectively in the EPROM FETs 30 dominate the EPROM FET lightly doped "hot" electron suppression regions 56 formed in the EPROM region 34 NMOS FET 30 to thereby enable generation of "hot" electrons during programming of the EPROM 10.

Figure 4D:
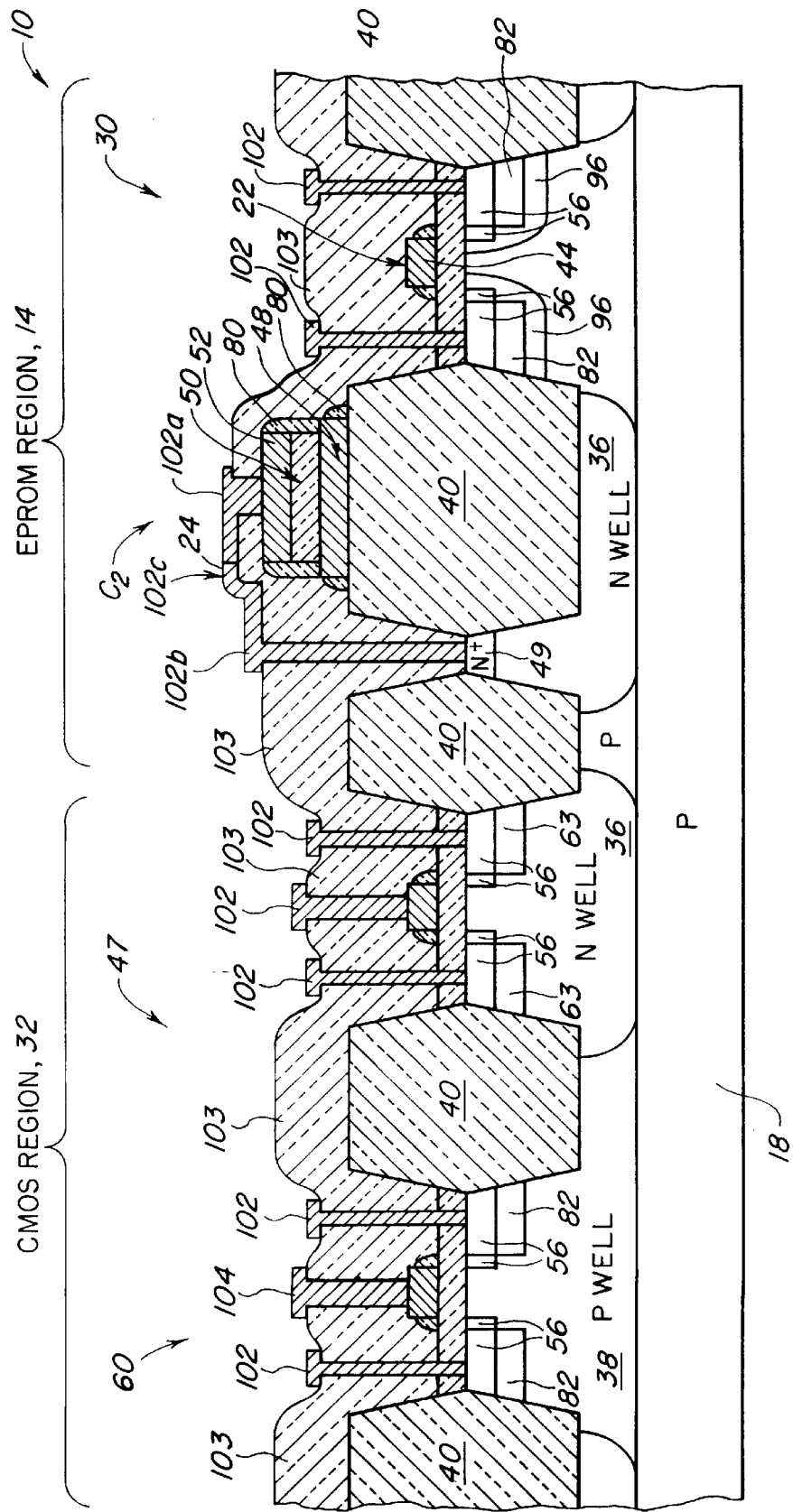

Referring now to FIG. 4D, a dielectric layer 103 is deposited over the structure, patterned with contacts, and a metallization layer is formed to provide contacts 102 to the upper plate 55 of the capacitor C2 (i.e., contact 102$a$) as well as to source and drain regions 56 of the NMOS FET 30 of the EPROM cell 10 and source/drain/gates of the CMOS FETs 47, 60 and ESD FETs, not shown. (It is noted that, for reasons to be discussed in connection with FIG. 7, a contact 102$b$ is made to the N$^+$ ohmic contact region 49 and such contact 102$b$ is connected to contact 102$a$ through electrical conductor 102$c$ thereby electrically connecting the upper plate electrode 55 of capacitor C2 to the N$^+$ ohmic contact region 49 and underlying N well 36.)

More particularly, referring now to FIGS. 5 and 6, it is noted that the first doped polycrystalline silicon layer 44 when patterned provides electrical connection between the floating gate 22 (i.e., the top plate of capacitor C1) and the bottom plate of the capacitor C2). Thus, it is noted that the NMOS FET 30 connected to capacitor C2 to form the EPROM cell 10 includes the additional, relatively high, doped regions 96 to dominate the "hot" carrier suppression doped regions 56 (FIG. 4D) and thereby create an abrupt junction to enable creation of "hot" carriers during the programming mode and enable such generated "hot" carriers to become stored as charge on the floating gate 22 of capacitor C1. While the formation of the additional relatively high doped region 96 may be formed as an additional implantation step, here it is formed from the implantation step used in forming the ESD protection MOS FETs, not shown.

Figure 7A:
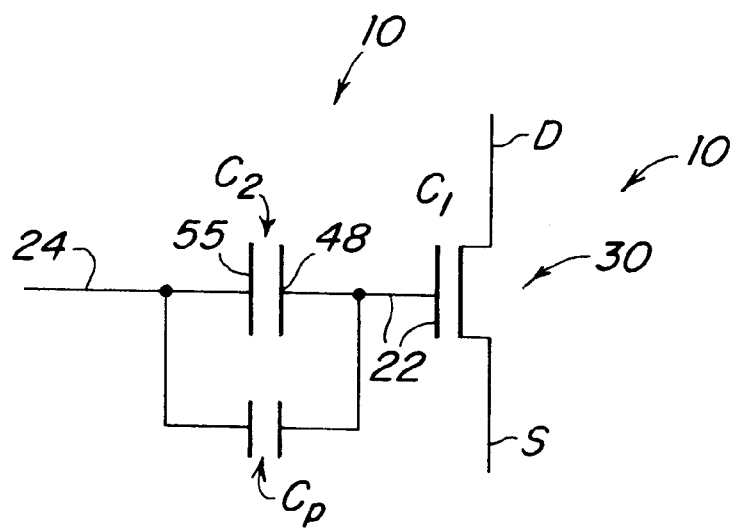
FIGS. 7A and 7B are equivalent schematic diagram and cross sectional diagrams useful in understanding one feature of the EPROM of FIG. 3.
Figure 7B:
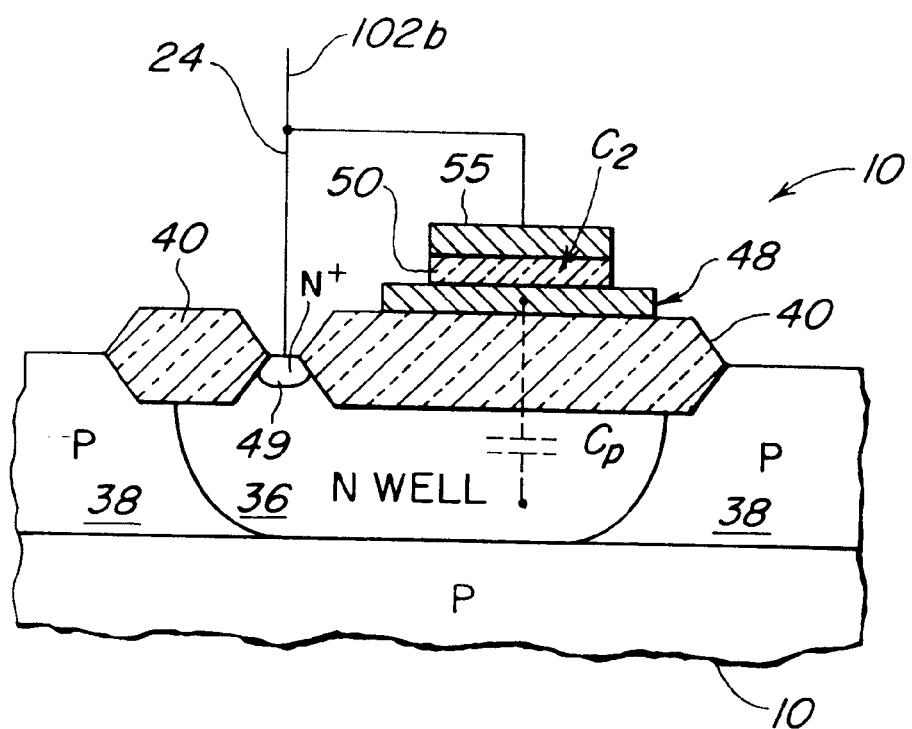

Referring now to FIGS. 7A and 7B, it is noted that there is a parasitic capacitance, Cp, between the lower plate 48 and the substrate 10 through the field oxide 40. Here, the upper plate 55 is connected to the N well 36 by contact 102$b$, as shown in FIGS. 4D and 7B thereby resulting in the parasitic capacitor, Cp, being connected in parallel with the capacitance C2 formed between the upper and lower plates 48, 55, respectively, of capacitor C2, as shown in FIG. 7A. This results in an increased C2/C1 coupling ratio as compared with an arrangement which does not connect the upper plate 55 to the N well 36.

To program the EPROM cell 10, the complete wafer is erased in the manufacturing line using a UV cure machine. These can later be programmed by applying voltages to the control gate electrode 24 and the source and drain regions of the EPROM NMOS FET 30. Using this wafer erase procedure, no change is necessary to conventional CMOS passivation.

Other embodiments are within the spirit and scope of the appended claims.

What is claimed is:

1. A electronic programmable read-only-memory comprising:

(a) a field effect transistor having: relatively heavy doped source and drain regions separated by an oppositely doped channel region; a gate electrode disposed over the channel region; lightly doped regions, having the same conductivity type as the source and drain regions, extending laterally from the source and drain regions to peripheral regions of the channel region; and, relatively heavy doped regions, having the same conductivity type as the source and drain regions, extending laterally from the source and drain regions, through and beyond the lightly doped regions, into the channel region; and (b) a charge storing capacitor coupled to the gate electrode and adapted to store charge produced in the channel region in response to a logic state programming voltage applied between one of the source and drain regions and the gate electrode.

2. The electronic programmable read-only-memory recited in claim 1 wherein the heavily doped regions extend into the channel region and terminates under the gate electrode.

3. The electronic programmable read-only-memory recited in claim 1 comprising:

an additional doped region having the same conductivity type as the source and drain regions; and an insulating material over the additional doped region; and wherein the capacitor is laterally spaced from the transistor, an upper plate of a pair of plates of the capacitor is electrically connected to the additional doped region through an electrical conductor and a lower one of the pair of plates is capacitively coupled to the additional doped region through the insulating material.

4. A electronic programmable read-only-memory comprising:

a semiconductor body having formed therein:

(a) a field effect transistor, comprising:

relatively lightly doped source and drain regions having first type conductivity separated by an oppositely doped channel region;

a gate electrode disposed over an inner portion of the channel region;

lightly doped regions having the first type conductivity extending from the source and drain regions to a region in the channel region disposed under the gate electrode;

a relatively heavy doped region having the first type conductivity in the relatively lightly doped regions to provide a relatively highly doped region having the first type conductivity extending from the source and drain regions beyond the lightly doped regions to regions disposed under the gate electrode; and (b) a charge storing capacitor coupled to the gate electrode and adapted to store charge produced in the channel region in response to a logic state programming voltage applied between one of the source and drain regions and the gate electrode.

5. The electronic programmable read-only-memory recited in claim 4 wherein the capacitor includes a pair of plates separated by a dielectric, and wherein one of the plates and the gate electrode comprises a common layer of polycrystalline silicon.

6. The electronic programmable read-only-memory recited in claim 4 wherein the semiconductor body comprises:
    an additional doped region having the first conductivity type; and
    an insulating material over the doped region; and
wherein the capacitor is laterally spaced from the transistor, an upper plate of a pair of plates of the capacitor is electrically connected to the additional doped region through an electrical conductor and a lower one of the pair of plates being capacitively coupled to the additional doped region through the insulating material.

* * * * *